(12) United States Patent  (10) Patent No.: US 9,148,054 B2
Chiang et al.  (45) Date of Patent: Sep. 29, 2015

(54) VOLTAGE REGULATORS WITH KICKBACK PROTECTION

(71) Applicant: Volterra Semiconductor Corporation, Fremont, CA (US)

(72) Inventors: Chiteh Chiang, San Jose, CA (US); Marco A. Zuniga, Palo Alto, CA (US); Yang Lu, Fremont, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 111 days.

(21) Appl. No.: 13/830,535

(22) Filed: Mar. 14, 2013

(65) Prior Publication Data

US 2014/0266130 A1     Sep. 18, 2014

(51) Int. Cl.
  *G05F 3/04*   (2006.01)
  *H02M 3/156*  (2006.01)
  *H02M 3/158*  (2006.01)
  *H03K 17/06*  (2006.01)
  *H02M 1/00*   (2007.01)

(52) U.S. Cl.
  CPC ............ *H02M 3/156* (2013.01); *H02M 3/1588* (2013.01); *H03K 17/063* (2013.01); *H02M 2001/0054* (2013.01); *H03K 2217/0036* (2013.01); *H03K 2217/0081* (2013.01); *Y10T 307/50* (2015.04)

(58) Field of Classification Search
  CPC ................................ H02M 3/158; G05F 3/08
  USPC ........... 323/222, 282, 288, 311; 327/403, 537
  See application file for complete search history.

(56) References Cited

U.S. PATENT DOCUMENTS

| | | | |
|---|---|---|---|
| 6,172,493 B1 * | 1/2001 | Grant | 323/288 |
| 7,265,601 B2 * | 9/2007 | Ahmad | 327/403 |
| 7,514,908 B2 | 4/2009 | Hosokawa et al. | |
| 7,567,065 B2 * | 7/2009 | Matsuo et al. | 323/222 |
| 7,679,218 B1 | 3/2010 | Isham | |
| 7,936,156 B2 * | 5/2011 | Hasegawa et al. | 323/282 |
| 8,067,928 B2 | 11/2011 | Nakamura et al. | |
| 8,154,334 B2 * | 4/2012 | Wang | 327/537 |
| 8,207,720 B2 | 6/2012 | Tang et al. | |
| 8,222,879 B2 * | 7/2012 | Nguyen | 323/282 |
| 8,710,816 B2 | 4/2014 | Miyazaki | |

* cited by examiner

*Primary Examiner* — Timothy J Dole
*Assistant Examiner* — Htet Kyaw
(74) *Attorney, Agent, or Firm* — Lathrop & Gage LLP

(57) ABSTRACT

The subject matter of this document can be embodied in a method that includes a voltage regulator having an input terminal and an output terminal. The voltage regulator includes a high-side transistor between the input terminal and an intermediate terminal, and a low-side transistor between the intermediate terminal and ground. The voltage regulator includes a low-side driver circuit including a capacitor and an inverter. The output of the inverter is connected to the gate of the low-side transistor. The voltage regulator also includes a controller that drives the high-side and low-side transistors to alternately couple the intermediate terminal to the input terminal and ground. The controller is configured to drive the low-side transistor by controlling the inverter. The voltage regulator further includes a switch coupled to the low-side driver circuit. The switch is configured to block charge leakage out of the capacitor during an off state of the low-side transistor.

9 Claims, 6 Drawing Sheets

VOLTAGE REGULATORS WITH KICKBACK PROTECTION

TECHNICAL FIELD

The following disclosure relates to semiconductor voltage regulator devices.

BACKGROUND

Voltage regulators, such as DC to DC converters, are used to provide stable voltage sources for electronic systems. Efficient DC to DC converters are particularly needed for battery management in low power devices, such as laptop notebooks and cellular phones. Switching voltage regulators (or simply "switching regulators") are known to be efficient DC to DC converters. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

SUMMARY

In general, in one aspect this disclosure features a method that includes a voltage regulator having an input terminal and an output terminal. The voltage regulator includes a high-side transistor between the input terminal and an intermediate terminal, and a low-side transistor between the intermediate terminal and ground. The voltage regulator also includes a low-side driver circuit including a capacitor and an inverter. The output of the inverter is connected to the gate of the low-side transistor. The voltage regulator also includes a controller that drives the high-side and low-side transistors to alternately couple the intermediate terminal to the input terminal and ground, wherein the controller is configured to drive the low-side transistor by controlling the inverter. The voltage regulator further includes a switch coupled to the low-side driver circuit. The switch is configured to block charge leakage out of the capacitor during an off state of the low-side transistor.

In another aspect, the disclosure includes a voltage regulator having an input terminal and an output terminal. The voltage regulator includes a high-side transistor between the input terminal and an intermediate terminal, wherein the high-side transistor is connected to a high-side driver circuit. The voltage regulator also includes a low-side transistor between the intermediate terminal and ground, wherein the low side transistor is connected to a low-side driver circuit that includes a capacitor and an inverter. The voltage regulator further includes a controller connected to the high-side and low-side driver circuits to alternately couple the intermediate terminal to the input terminal and ground. The inverter includes a positive voltage terminal configured to be connected to a first direct current (DC) voltage source, and a negative voltage terminal configured to be connected to a second, different DC voltage source.

Implementations can include one or more of the following. The switch can include an isolation transistor that turns off during the off state of the low-side transistor. The voltage regulator can include a second inverter connected to the gate of the isolation transistor, wherein the controller is configured to turn off the isolation transistor through the second inverter during the off state of the low-side transistor. The low-side transistor can be an nMOS transistor and the isolation transistor can be a pMOS transistor. The low-side transistor can be a pMOS transistor and the isolation transistor can be an nMOS transistor. The inverter can include a positive voltage terminal that is connected to a drain of the isolation transistor. The inverter can include a negative voltage terminal that is connected to one other negative voltage terminal of a second inverter connected to the gate of the isolation transistor. The low side transistor can be partially turned on during the on-state of the high-side transistor. The switch can include a diode circuit.

A low-side threshold voltage to turn on the low-side transistor can be less than a difference between the respective outputs of the first and second DC voltage sources. The low-side threshold voltage can be greater than the output of the second DC voltage source. The low-side threshold voltage can be such that a difference between the low-side threshold voltage and the output voltage of the second DC voltage source is substantially equal to a high-side threshold voltage for turning on the high-side transistor. The threshold voltage can be between 2.3V and 4V. The first DC voltage source can provide a voltage substantially equal to 12V. The second DC voltage source can provide a voltage substantially equal to 1.8V. The capacitor can be connected between an internal ground of the voltage regulator and the drain of an isolation transistor. The low-side transistor can be an nMOS transistor and the isolation transistor can be a pMOS transistor. The low-side transistor can be a pMOS transistor and the isolation transistor can be an nMOS transistor. The source of the isolation transistor can be connected to the high-side driver circuit. The isolation transistor can be controlled by the controller through a second inverter connected to the gate of the isolation transistor.

Certain implementations may have one or more of the following advantages. By having an adjustable DC voltage source to drive a gate of the power transistor, efficiency of a voltage regulator can be increased. Having an adjustable DC voltage source can help in quickly pulling up the voltage at an intermediate node of the voltage regulator, thereby reducing switching time. Adequate saturation current needed to drive the switching transition can be provided by adjusting the DC voltage source in accordance with the output current. Adjusting the voltage to a low value, except when needed for pulling up the intermediate terminal, can increase the life expectancy of oxide layers of the voltage regulator, and hence that of the integrated circuit housing the voltage regulator.

Providing a switch to prevent a discharge (often referred to as a kickback discharge) from the low-side drive circuit can reduce switching time by maintaining an adequate pull down strength of the low-side drive circuit. A transistor-based switch provided within the integrated circuit can obviate the need for an external resistor (to prevent the discharge) which in turn increases the charging time. The transistor based switch can provide discharge protection without introducing a voltage drop associated with using a simple diode.

Connecting the low-side driver circuit to a DC voltage source (rather than the ground) can also provide discharge protection, while increasing efficiency of the regulator by having a reduced voltage swing. The reduced swing in turn can achieve power savings. Connecting the low-side driver circuit to a DC voltage source can also provide more options to a device designer. For example, the threshold voltage of the high-side device can be lowered to a value such that an effective threshold voltage of the high-side device is substantially same as or at least comparable to the threshold voltage of the low-side device. This in turn can increase efficiency by reducing diode reverse recovery losses associated with the regulator. By making the DC voltage source adjustable, the integrated circuit can be made adaptive to a range of ground bounce (elevation of the internal ground of the integrated circuit with respect to the actual ground, due to, for example, the presence of parasitic inductances) associated with the integrated circuit.

The details of one or more implementations are set forth in the accompanying drawings and the description below. Other features, aspects, and advantages will become apparent from the description, the drawings, and the claims.

DESCRIPTION OF DRAWINGS

Exemplary implementations will hereinafter be described in conjunction with the appended drawings, wherein like designations denote like elements, and wherein.

DETAILED DESCRIPTION

Power electronics and systems are in a continuous push to continue to improve overall performance. Performance can be measured, for example, by power dissipation, electrical robustness/reliability, and cost. These metrics can be affected, for example, by the device architecture choices, circuit architecture choices. For example, the demand for lower power dissipation and switching loss has resulted in lower gate drive voltage levels while maintaining or improving drive current.

Figure 1:
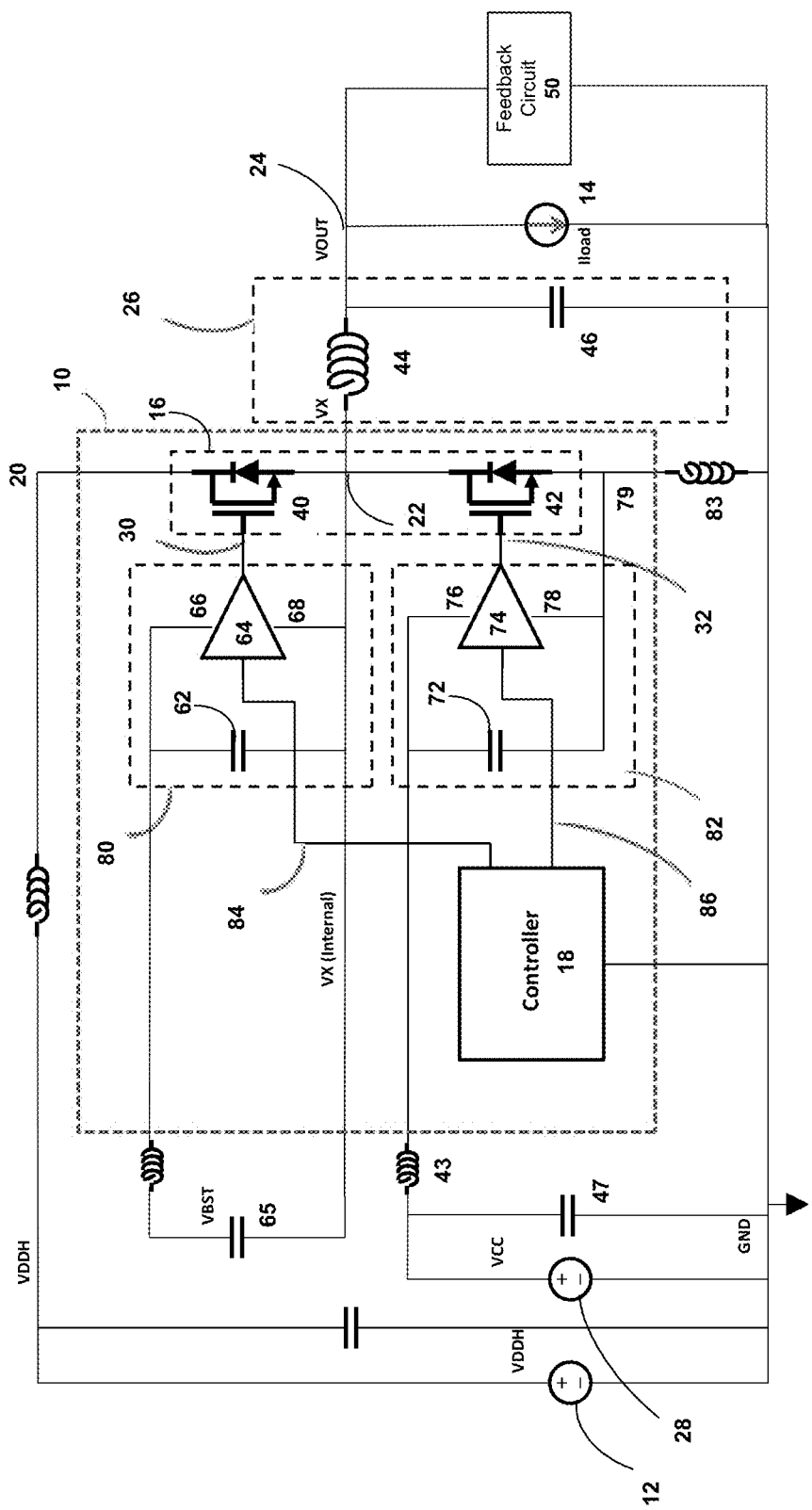
FIG. 1 is a circuit diagram of a switching regulator.

Referring to FIG. 1, a switching regulator 10 is coupled to a first high direct current (DC) input voltage source 12, such as a battery, by an input terminal 20. The voltage at the input terminal 20 can be referred to as $V_{DDH}$. The switching regulator 10 is also coupled to a load 14, such as an integrated circuit, by an output terminal 24. The switching regulator 10 serves as a DC-to-DC converter between the input terminal 20 and the output terminal 24. The switching regulator 10 includes a switching circuit 16 which serves as a power switch for alternately coupling and decoupling the input terminal 20 to an intermediate terminal 22. The switching circuit 16 includes a rectifier, such as a switch or diode, coupling the intermediate terminal 22 to ground. Specifically, the switching circuit 16 can include a first transistor 40, called a high-side transistor, having a source connected to the input terminal 20 and a drain connected to the intermediate terminal 22 and a second transistor 42, called a low-side transistor, or synchronous transistor, having a drain connected to ground and a source connected to the intermediate terminal 22.

In one implementation, the first transistor 40 can be a Positive-Channel Metal Oxide Semiconductor (PMOS) transistor, and the second transistor 42 can be a Negative-Channel Metal Oxide Semiconductor (NMOS) transistor. In another implementation, the first transistor 40 and the second transistor 42 can both be NMOS transistors. In another implementation, the first transistor 40 can be a PMOS, NMOS, or a Lateral Double-diffused Metal Oxide Semiconductor (LDMOS), and the second transistor 42 can be an LDMOS.

The intermediate terminal 22 is coupled to the output terminal 24 by an output filter 26. The output filter 26 converts the rectangular waveform of the intermediate voltage at the intermediate terminal 22 into a substantially DC output voltage at the output terminal 24. Specifically, in a buck-converter topology, the output filter 26 includes an inductor 44 connected between the intermediate terminal 22 and the output terminal 24 and a capacitor 46 connected in parallel with the load 14. During a high-side conduction period, the first transistor (also referred to as the high-side transistor) 40 is closed (or switched on), and the DC input voltage source 12 supplies energy to the load 14 and the inductor 44 via the first transistor 40. On the other hand, during a low-side conduction period, the second transistor (also referred to as the low side transistor) 42 is closed, and current flows through the second transistor 42 as energy is supplied by the inductor 44. The resulting output voltage $V_{OUT}$ is a substantially DC voltage.

The switching regulator also includes a controller 18, a high-side driver (also referred to as a high-side driver circuit) 80 and a low-side driver (also referred to as a low-side driver circuit) 82 for controlling the operation of the switching circuit 16. A first control line 30 connects the high-side transistor 40 to the high-side driver 80, and a second control line 32 connects the low-side transistor 42 to the low-side driver 82. The high-side and low-side drivers are connected to the controller 18 by control lines 84 and 86, respectively. The controller 18 causes the switching circuit 16 to alternate between high-side and low-side conduction periods so as to generate an intermediate voltage $V_X$ at the intermediate terminal 22 that has a rectangular waveform. The controller 18 can also include a feedback circuit 50, that can be configured to measure the output voltage $V_{OUT}$ and the current $I_{load}$ passing through the output terminal 24. Although the controller 18 is typically a pulse width modulator, the methods and systems described in this document can be also applicable to other modulation schemes, such as pulse frequency modulation.

In some implementations, the high-side transistor 40 and the high-side driver 80 can be collectively referred to as a high-side device. The high side driver 80 can include a high-side capacitor 62 and a high-side inverter 64. The high-side inverter 64 includes a positive voltage terminal 66 that is coupled to a capacitor 65 that is configured to hold a boost voltage $V_{BST}$ for the high-side driver. The high-side inverter 64 also includes a negative voltage terminal 68 that is connected to the intermediate terminal 22 of the switching regulator 10. The high-side inverter 64 can be connected to the controller 18 by the control line 84, and to the gate of the high-side transistor 40 by the control line 30. The controller 18 can be configured to control the inverter 64 to switch on or switch off the high-side transistor 40.

In some implementations, the low-side transistor 42 and the low-side driver 82 can be collectively referred to as a low-side device. The low-side driver 82 can include a low-side capacitor 72 and a low-side inverter 74. The low-side inverter 74 includes a positive voltage terminal 76 that is coupled to a second DC input voltage source 28. The voltage $V_{CC}$ from the DC voltage source 28 can be used to supply power to the low-side driver 82. In some implementations, the DC voltage source 28 can be adjustable such that the output of the DC voltage source 28 can be varied within a range. The low-side inverter 74 also includes a negative voltage terminal 78 that is connected to the internal ground terminal 79 of the switching regulator 10. The internal ground 79 of the switching regulator 10 can be at a different potential than the actual ground because of the presence of parasitic inductances represented in FIG. 1 as the inductor 83. The low-side inverter 74 can be connected to the controller 18 by the control line 86, and to the gate of the low-side transistor 42 by the control line 32. The controller 18 can be configured to control the inverter 74 to switch on or switch off the low-side transistor 42.

A voltage $V_{DDH}$, for example 12V, is applied to the high-side transistor 40, and when the high-side transistor 40 is on, current flows through the transistor 40 and the inductor 44. In contrast, when the low-side transistor 42 is on, the inductor 44 pulls current from the ground. Under normal operation, the regulator 10 switches between turning the high-side transistor 40 and the low-side transistor 42 on such that the output of the filter 26 produces the desired voltage $V_{OUT}$. $V_{OUT}$ is a voltage between 0V and $V_{DDH}$.

To improve efficiency of the regulator, it is desirable to have the high-side transistor 40 on while the low-side transistor 42 is off, and vice versa. However, some deadtime may be required between the switching in order to avoid having both transistors 40, 42 on and at same time, which can cause shoot-through and result in significant efficiency losses and damage to the transistors. Thus, there is a short period, the intrinsic deadtime $t_d$, between each high-side conduction and low-side conduction period in which both transistors are open.

When both transistors 40, 42 are off, current through the inductor 44 will not instantly drop to zero. The voltage across the inductor is determined by Equation 1:

$$V = L(di/dt),$$ (Equation 1)

where V is the voltage, L is the inductance, and i is the current in the inductor. As the inductor current decreases, the voltage at the input end, i.e. near $V_{DDH}$, of the inductor is forced to be negative. When this voltage reaches a value (e.g. −0.7 V) that causes the low-side transistor 42 to reach a corresponding threshold voltage, the low-side transistor 42 begins conducting current into the inductor.

The high-side transistor 40 and the low-side transistor 42 can be controlled by controlling the gate voltage at the respective gates. Changing the gate voltage of the transistors can affect power dissipation and/or efficiency of the regulator 10. In some implementations, if the gate voltage is adjusted such that a voltage between the gate and source ($V_{gs}$) is increased, the increase can result in a lower ON-resistance (or higher conductance), thereby reducing resistive losses associated with the corresponding transistor. However, in some implementations, an increased $V_{gs}$ can result in an increased switching loss.

In some cases, when the high-side transistor is switched on and current flows from the DC source 12 through the high-side transistor 40 into the inductor 44, the voltage at the intermediate terminal 22 can drop to a voltage lower than the $V_{gs}$ of the high-side transistor 40. This can lead to a drop in the value of $V_{BST}$ due to, for example, charge sharing with the gate of the high-side transistor 40. For example, for devices having Vgs of about 1.8V, the voltage at the intermediate terminal 22 can drop to about 0.9V during the switching, which can in turn lead to a loss in saturation current available for driving the switching transition. This can result in a slow pull up of the voltage at the intermediate terminal 22, resulting in increased switching losses.

In some implementations, the switching losses can be reduced by preventing the drop in $V_{BST}$. This can be done, for example, by adjusting $V_{CC}$ in accordance with an output current and providing circuitry to ensure that Vgs is adjusted accordingly and enough saturation current is available for the high-side transistor 40 during the switching transition.

Figure 2:
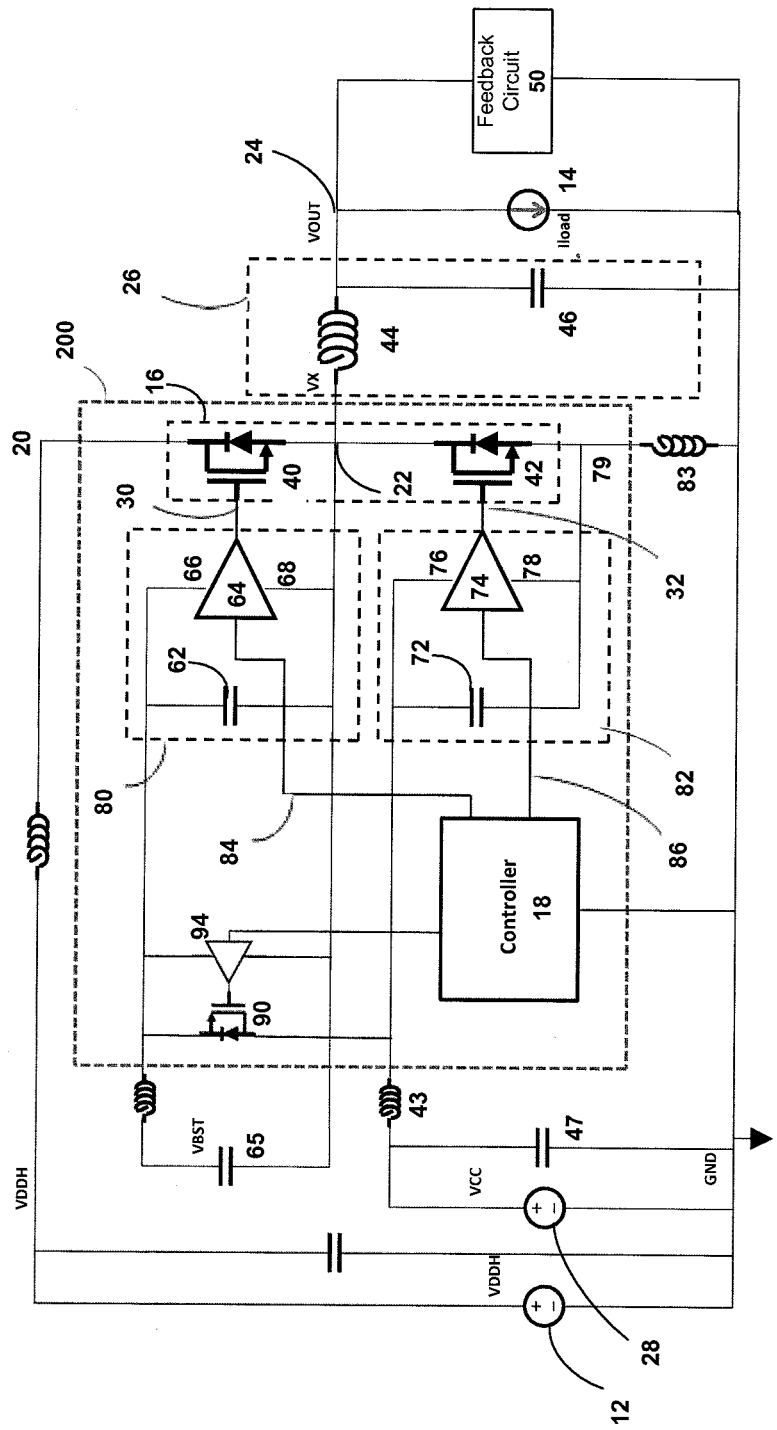
FIG. 2 is a circuit diagram of a switching regulator where a DC voltage source is adjusted in accordance with an output current.

FIG. 2 shows a switching regulator 200 configured to increase efficiency and reduce switching losses. The regulator 200 includes a transistor 90 driven by an inverter 94. The inverter, and consequently the transistor 90 can be controlled by the controller 18. The transistor 90 is of a different type than transistors 40 and 42. For example, if transistors 40 and 42 are nMOS type transistors (i.e., n-channel MOSFETs), then the transistor 90 is of pMOS type (i.e., a p-channel MOSFET). Alternatively, if the transistors 40 and 42 are of pMOS type, the transistor 90 is of nMOS type. A source of the transistor 90 is connected to the positive voltage terminal 66 of the high-side inverter 64, and a drain of the transistor 90 is coupled to the DC voltage source 28. Other portions of the regulator 200 can be substantially identical to the regulator 10 described with reference to FIG. 1.

In operation, when the high-side device is turned on, current flows from the DC source 12 through the high-side transistor 40 and into the load 14. The feedback circuit 50 can measure the load current $I_{load}$ and provide a feedback signal for adjusting $V_{CC}$ in accordance with the load current. The transistor 90 maintains an adequate drive voltage for the high side device such that the saturation current of the high-side transistor 40 does not decrease with an increase in the load current.

In some implementations, the DC voltage source 28 can be regulated by a different controller internal or external to the regulator 200, based on the feedback signal from the feedback circuit 50. In other implementations, the DC voltage source 12 can be connected to replace the DC voltage source 28.

As the $V_{CC}$ is increased in accordance with the load current, the transistor 90 is switched on to maintain the drive voltage for the high-side transistor 40 and enough saturation current at the high-side transistor 40 is made available to make the switching fast and efficient. In some implementations, the overdrive in the high-side transistor 40 is low (e.g., 0.9V for a threshold of 0.5V), and a small change in $V_{gs}$ leads to a comparatively large increase in the saturation current.

The $V_{CC}$ can be varied monotonically for a range of output current values. For example, for a no-load condition (i.e., an output current of 0 A), $V_{CC}$ can be between 1.7V and 1.8V. For a load current of 30 A, $V_{CC}$ can be increased to, for example, 2V, to compensate for the additional load current. For output current values between 0 A and 30 A, $V_{CC}$ can be monotonically varied from between 1.7V-1.8V and 2V, respectively. Within this range, $V_{CC}$ can be, for example, a linear or quadratic function of the output current.

Referring back to FIG. 1, when the low-side transistor 42 turns off and the high-side transistor 40 turns on, the switching can result in large voltage transients on the intermediate terminal 22. The resulting fast rate of voltage change can produce a displacement current on the drain side of the low-side transistor 42, due to, for example, presence of parasitic inductance represented by the inductor 83. The displacement current can cause the gate voltage of the low-side transistor to rise momentarily, thereby partially turning on the low-side transistor 42. A combination of the above effects causes the internal ground 79 of the regulator to be pulled up to a level higher than the external ground. This is often referred to as a ground bounce, and causes the capacitor 72 to discharge through the inductor 43 into the off-chip bypass capacitor 47. Due to this discharge of the capacitor 72, the pull-down strength (also referred to as the drive) of the low-side transistor 42 is reduced. A combination of the weaker pull-down strength and the gate voltage induced by the displacement current can result in switching losses often referred to as kickback. In some implementations, the kickback can be reduced by placing a sufficiently high valued resistor in the discharge path, for example, between the inductor 43 and the capacitor 47. While such a resistor can be effective in reducing the kickback, the resistor can also undesirably increase a charge-up time (also referred to as a rise time) for the capacitor 72.

Figure 3:
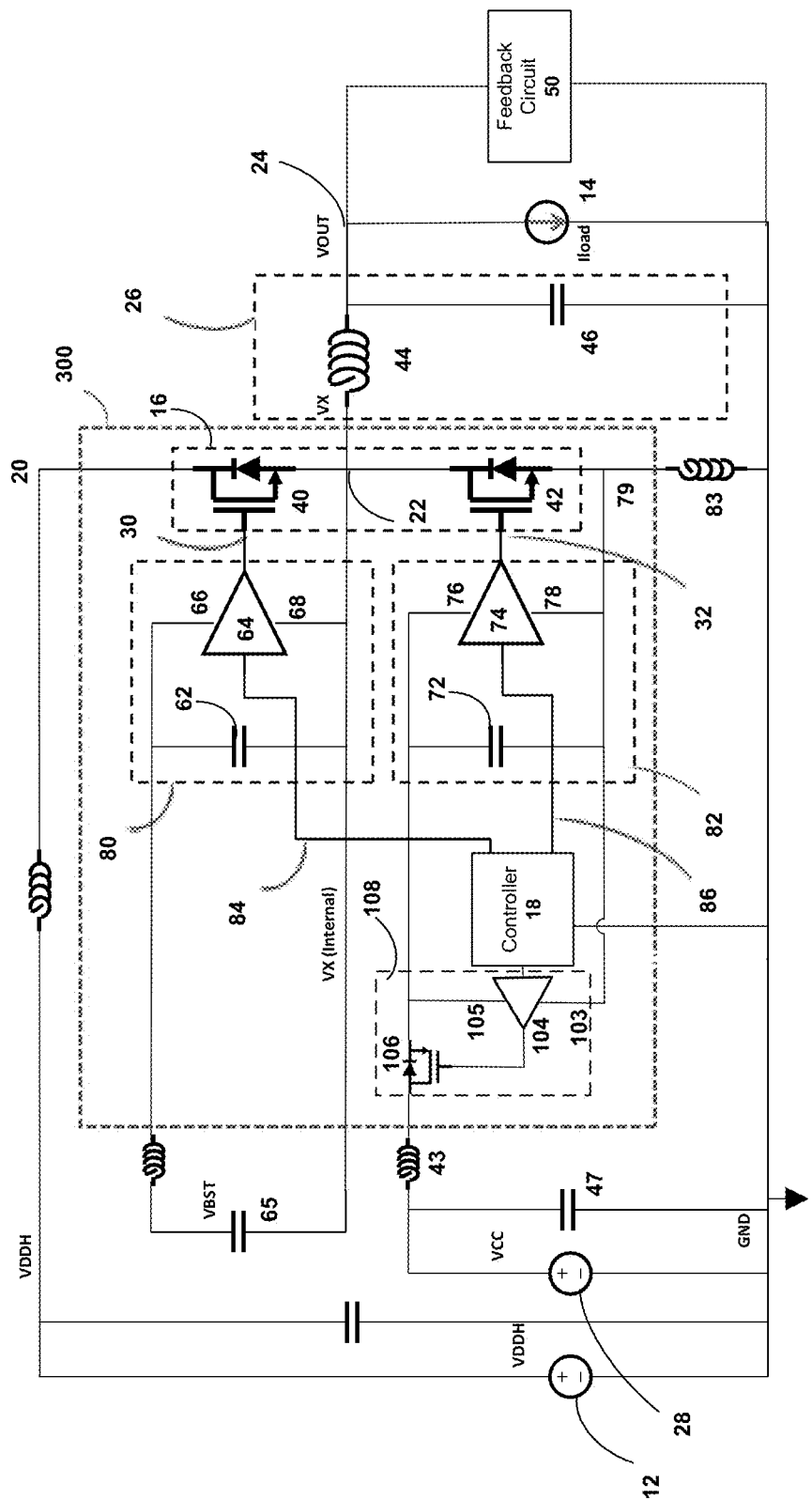
FIG. 3 is a circuit diagram of a switching regulator with low-side discharge protection.

In some implementations, the kickback can be reduced by providing a discharge protection switch within the regulator. An example of such a regulator 300 is shown in FIG. 3. The regulator 300 includes an internal switch 108 that prevents the capacitor 72 from discharging into the capacitor 47 possibly through the parasitic inductor 43. In some implementations, the switch 108 includes a transistor 106 and an inverter 104. The transistor 106 is of a different type than the transistors 40 and 42. For example, if transistors 40 and 42 are nMOS type transistors, then the transistor 106 is of pMOS type. Alternatively, if the transistors 40 and 42 are of pMOS type, the transistor 106 is of nMOS type. In some implementations, the transistor 106 can be referred to as an isolation transistor. A drain of the transistor 106 is connected to the external capacitor 47 and the positive terminal of the DC voltage source 28, possibly through the parasitic inductor 43. The source of the transistor 106 is coupled to the positive voltage terminal 76 of the low-side inverter 74. The gate of the transistor 106 is connected to the inverter 104 that controls the transistor 106 based on control signals received from the controller 18. The positive voltage terminal 105 of inverter 104 is connected to the source of the transistor 106, and the negative voltage terminal 103 of the inverter 104 is connected to the internal ground 79.

In operation, when the internal ground 79 is pulled up to a level higher than the actual ground, and a kickback condition is created, the controller 18 can be configured to switch off the transistor 106 thereby opening the switch 108. This opens the connection between the capacitor 72 and the external bypass capacitor 47, thereby preventing a discharge from the capacitor 72. The capacitor 72 can therefore retain the charge necessary for providing adequate pull-up strength for the low-side transistor 42, thereby reducing the switching losses resulting from the kickback effect. By using a transistor based switch 108 rather than a diode, undesirable diode drops in the charging path of the capacitor 72 can be avoided.

Figure 4:
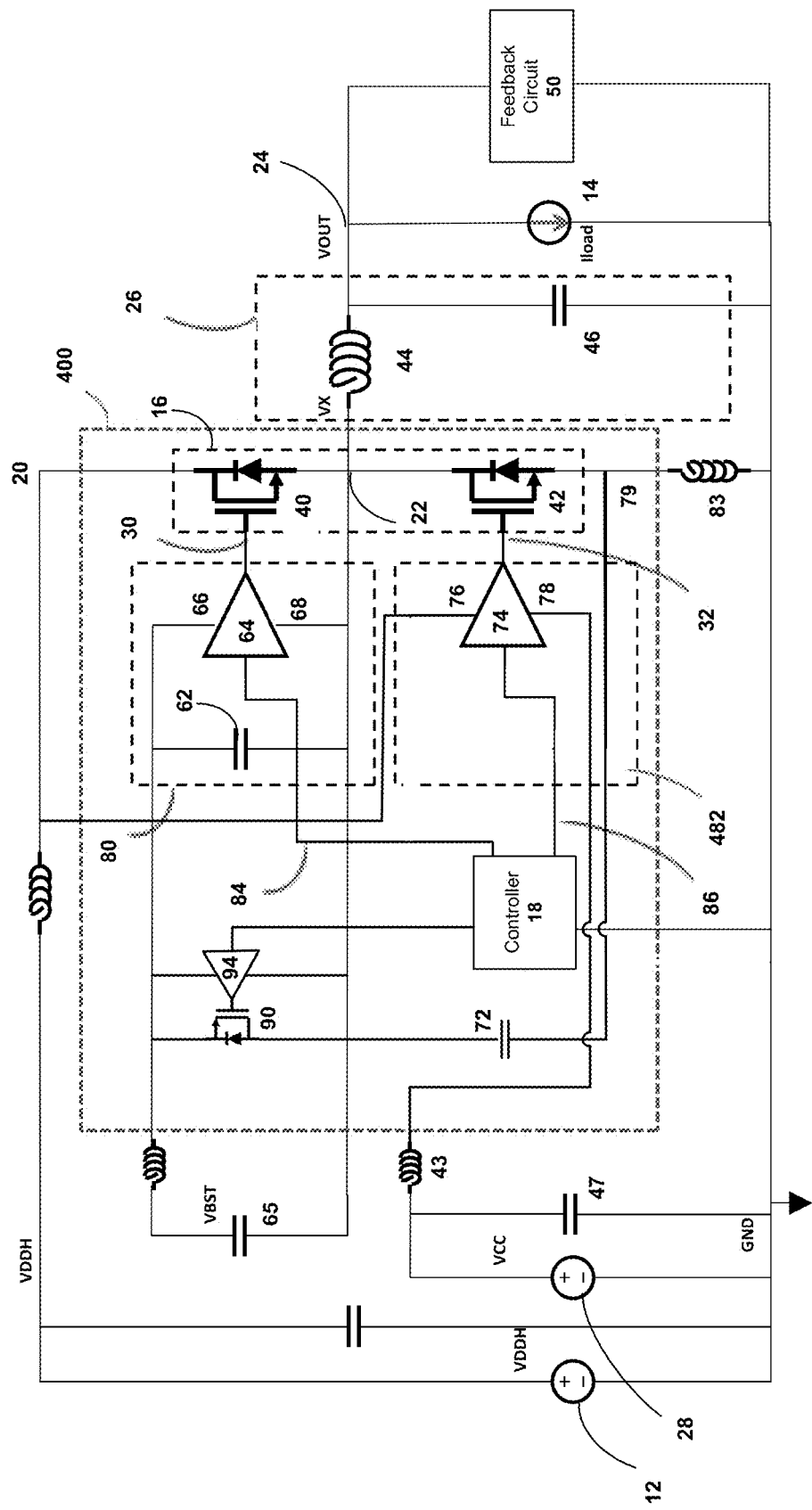
FIG. 4 is a circuit diagram of a switching regulator with low-side discharge protection.

FIG. 4 shows another example configuration for reducing kickback related losses in a switching regulator. In this example, the regulator 400 includes a low-side driver 482 where the negative voltage terminal 78 of the low-side inverter 74 is connected to the DC voltage source 28 (rather than the internal ground 79). The positive voltage terminal 76 of the low-side inverter 74 is connected to the input terminal 20 such that the low-side inverter is powered on the positive voltage side by the DC voltage source 12. In some implementations, the capacitor 72 is connected between the internal ground and a source of the transistor 90. The output of the DC voltage sources 12 and 28 are kept at different levels. For example, the output $V_{DDH}$ of the DC voltage source 12 can be kept at 12V and the output $V_{CC}$ of the DC voltage source 28 can be kept at a lower value such as 1.8V.

The regulator 400 depicted in FIG. 4 can provide several advantages. For example, undesirable kickback related effects can be reduced by blocking a discharge of the capacitor 72 using the transistor 90. When the low-side device is turned off, the controller 18 can be configured to open the transistor 90 such that the capacitor 72 does not discharge to, for example, the capacitor 65.

Using a non-zero $V_{CC}$ as a ground reference reduces the voltage difference between the positive and negative voltage terminals (76 and 78, respectively), and can lead to significant savings in power consumption. For example, if the $V_{DDH}$ is at 12V, and the $V_{CC}$ is at 1.8V, the difference between the terminals is 10.2V (rather than 12V for the case when the negative voltage terminal 78 is connected to ground), and a power saving proportional to a square of the ratio between 12 and 10.2 can be achieved. Such reduced gate voltage swing also reduces capacitive losses. Further, using the non-zero $V_{CC}$ bias in the OFF state of the low-side transistor 42 enables easier turn-on of the transistor 42 in the third quadrant of operation.

Using a non-zero $V_{CC}$ allows for increased flexibility in designing the regulator 400. Various levels of $V_{CC}$ can be used as long as $V_{CC}$ does not exceed the threshold voltage $V_T$ of the low-side transistor 42. For example, for $V_T$ of about 4V, VCC can be kept at 1.8V such that the effective threshold voltage $V_{Teff}$ is about 2.2V for the low-side transistor 42.

In some implementations, it can be desirable to have comparable threshold voltages for the high-side transistor 40 and the low-side transistor 42. While design limits prevent the threshold voltage of the low-side transistor to be as low as that of the high-side transistor (which can be, for example, 0.5V), having a small difference between the two threshold voltages helps in preventing effects such as reverse recovery losses. In some implementations, because an adjustable $V_{CC}$ can be used as the reference voltage for the low-side inverter 74, a device designer is afforded additional flexibility of manipulating the $V_T$ of the low-side transistor 42, such that the effective threshold voltage $V_{Teff}$ is substantially same as, or at least comparable to the threshold voltage of the high-side transistor 40. For example, for a $V_{CC}$ of 1.8V, $V_T$ can be designed to be around 2.3V (which is well within design limits), such that $V_{Teff}$ is about 0.5V.

Figure 5:
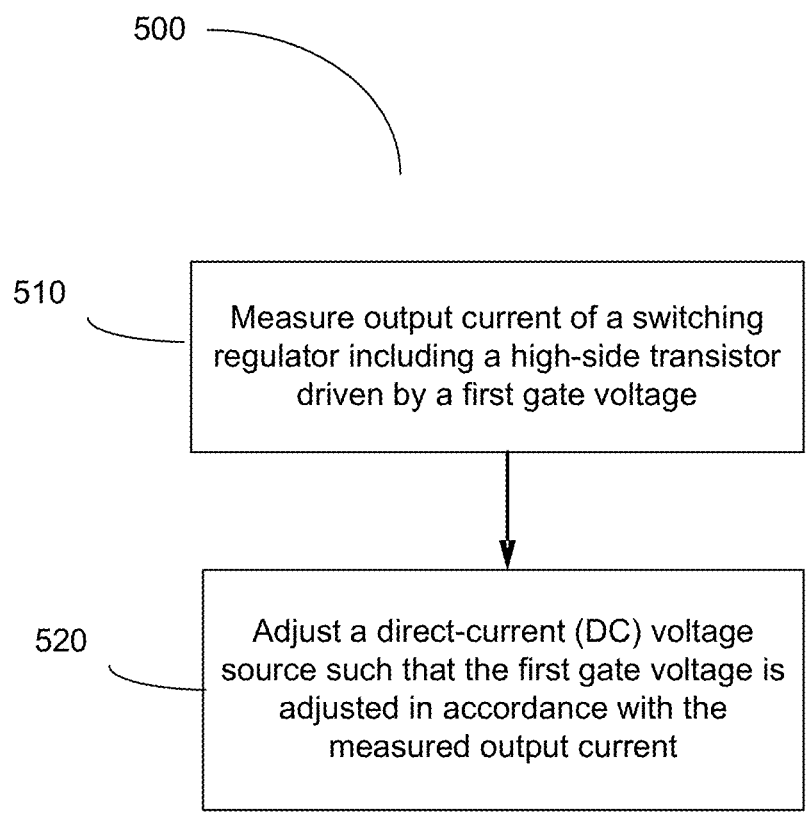
FIG. 5 is a flowchart showing an example sequence of operations for adjusting a DC voltage source in accordance with an output current.

FIG. 5 shows a flowchart 500 depicting an example sequence of operations for adjusting a DC voltage source of a regulator in accordance with the output current. Operations include measuring an output current of a switching transistor (510). The switching regulator can be substantially similar to any of the regulators, 10, 200, 300, and 400 described above with reference to FIGS. 1, 2, 3, and 4, respectively. The switching transistor can include a high-side transistor and a low side-transistor wherein the high-side transistor and the low-side transistor are driven using a first gate voltage and a second, different gate voltage, respectively.

Operations also include adjusting a DC voltage source of the switching regulator such that the first gate voltage is adjusted in accordance with the measured output current. As the output current increases, the DC voltage source can be adjusted to increase the first gate voltage. This can ensure that the saturation current through the high-side transistor remains substantially constant for different values of the output current and the potential at the drain of the high-side transistor does not drop significantly. Measurement of the output current can be done using, for example, a current sensor. The current sensor can be part of a feedback circuit such as the feedback circuit 50 described with reference to FIG. 1.

In some implementations, the feedback circuit can facilitate adjusting the DC voltage source, for example, by providing a suitable control signal to a controller of the adjustable DC voltage source. The feedback circuit can include a computing device that includes a processor, memory and storage device, for generating the control signal based on the measured output current. The DC voltage source can be adjusted as a monotonic function of the output current. For example, the output of the DC voltage source can be linearly increased within a range for a range of output current values. For example, for zero output current, the output of the DC voltage source can be between 1.7V and 1.8V, and for a 30 A output current, the output of the DC voltage source can be adjusted to about 2V. The output can vary is a linear, quadratic, or higher order monotonic fashion between, for example, 1.7V and 2V.

Figure 6:
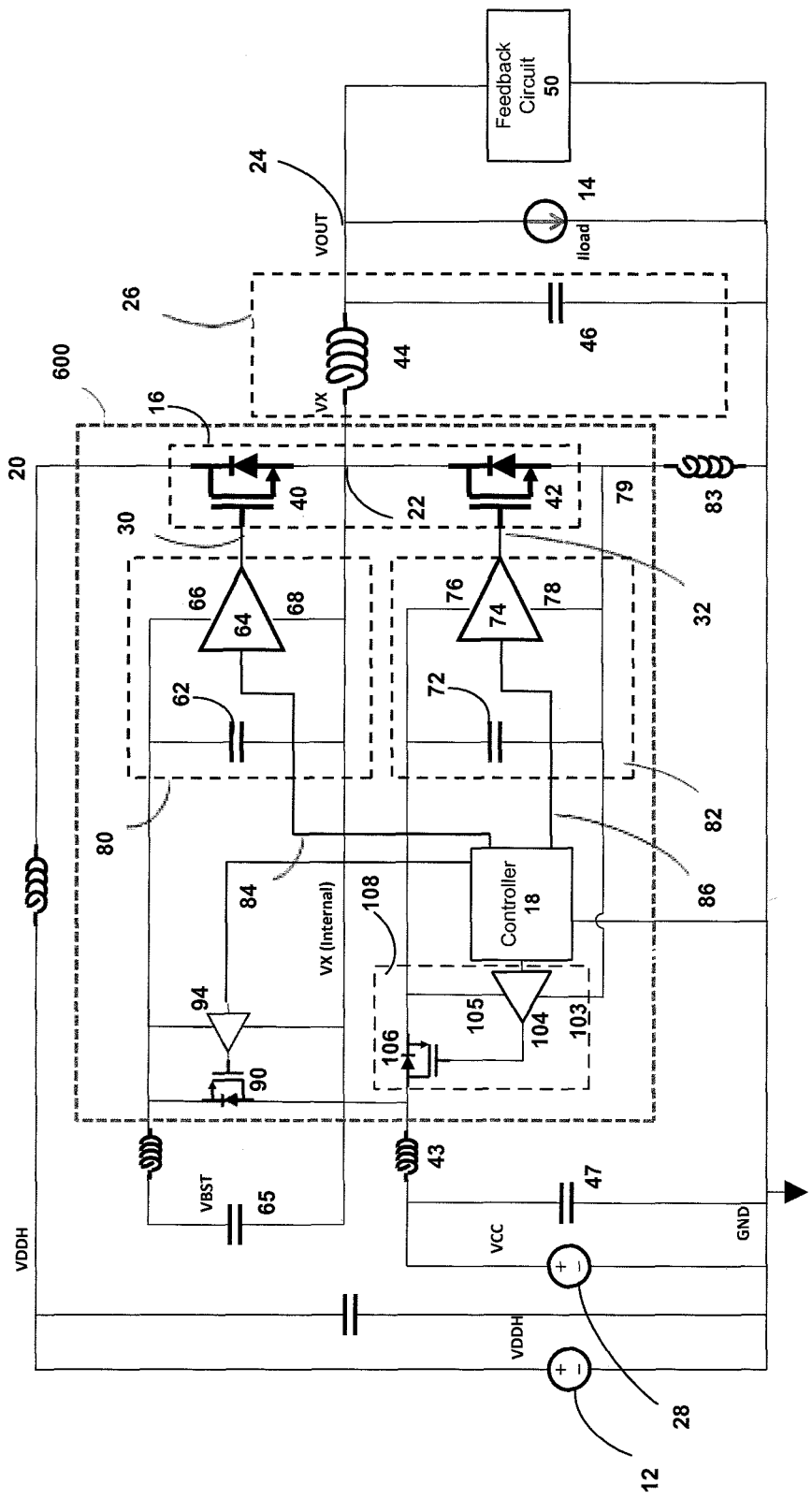
FIG. 6 is a circuit diagram of a switching regulator with low-side discharge protection like that of FIG. 3, but further including circuitry for adjusting a DC voltage source in accordance with output current.

A number of implementations have been described. Nevertheless, it will be understood that various modifications can be made without departing from the spirit and scope of the disclosure. Certain implementations can include combinations of features from the various implementations described above. For example, a kickback protection circuit can be used in conjunction with a feedback circuit for adjusting the VCC in accordance with the output current. For instance, FIG. 6 shows a regulator 600 like regulator 300 of FIG. 3, but further including transistor 90 and inverter 94 for varying $V_{CC}$ in accordance with load current in a manner similar to that discussed above with respect to FIG. 2. Other embodiments are within the scope of the following claims.

What is claimed is:

1. A voltage regulator having an input terminal and an output terminal, the voltage regulator comprising:
    a high-side transistor between the input terminal and an intermediate terminal;
    a low-side transistor between the intermediate terminal and ground;
    a low-side driver circuit including a low-side capacitor and a low-side inverter, wherein the output of the low-side inverter is connected to the gate of the low-side transistor;
    a controller that drives the high-side and low-side transistors to alternately couple the intermediate terminal to the input terminal and ground, wherein the controller is configured to drive the low-side transistor by controlling the low-side inverter;
    a switch coupled between the low-side driver circuit and a first node, the switch configured to block charge leakage out of the low-side capacitor during an off state of the low-side transistor;
    a high-side inverter connected to the gate of the high-side transistor;
    an additional transistor connected between the first node and a positive voltage terminal of the high-side inverter, such that the switch is electrically coupled in series between the additional transistor and the low-side driver circuit;
    feedback circuitry configured to generated a feedback signal representing magnitude of a load current passing through the output terminal; and
    a voltage source electrically coupled to the first node and configured to adjust magnitude of voltage at the first node in accordance with the feedback signal;
    the controller further configured to drive the additional transistor according to the feedback signal.

2. The voltage regulator of claim 1, wherein the switch includes an isolation transistor that turns off during the off state of the low-side transistor.

3. The voltage regulator of claim 2 comprising a second inverter connected to the gate of the isolation transistor, wherein the controller is configured to turn off the isolation transistor through the second inverter during the off state of the low-side transistor.

4. The voltage regulator of claim 2, wherein the low-side transistor is an nMOS transistor and the isolation transistor is a pMOS transistor.

5. The voltage regulator of claim 2, wherein the low-side transistor is a pMOS transistor and the isolation transistor is an nMOS transistor.

6. The voltage regulator of claim 2, wherein the low-side inverter includes a positive voltage terminal that is connected to a drain of the isolation transistor.

7. The voltage regulator of claim 2, wherein the low-side inverter includes a negative voltage terminal that is connected to one other negative voltage terminal of a second inverter connected to the gate of the isolation transistor.

8. The voltage regulator of claim 1, wherein the switch includes a diode circuit.

9. The voltage regulator of claim 1, further comprising an additional inverter connected to the gate of the additional transistor, the controller further configured to drive the additional transistor by controlling the additional inverter.

* * * * *